United States Patent [19]

Okamoto

[11] Patent Number: 5,247,483
[45] Date of Patent: Sep. 21, 1993

[54] SENSE AMPLIFIER CIRCUIT

[75] Inventor: Toshiyuki Okamoto, Tokyo, Japan

[73] Assignee: NEC Corporation, Japan

[21] Appl. No.: 819,261

[22] Filed: Jan. 10, 1992

[30] Foreign Application Priority Data

Jan. 22, 1991 [JP] Japan ................... 3-005485

[51] Int. Cl.$^5$ ............................. G11C 7/00
[52] U.S. Cl. .................... 365/205; 365/203; 365/204
[58] Field of Search ............... 365/203, 204, 207, 208, 365/205; 307/530, 355

[56] References Cited

U.S. PATENT DOCUMENTS

| 4,439,697 | 3/1984 | Suzuki et al. | 365/203 |
| 4,447,893 | 5/1984 | Murakami | 365/203 |
| 4,811,301 | 3/1989 | Houston | 365/203 |

FOREIGN PATENT DOCUMENTS 188097 8/1987 Japan ................... 365/203

Primary Examiner—Eugene R. LaRoche
Assistant Examiner—Vu Le
Attorney, Agent, or Firm—Laff, Whitesel, Conte & Saret

[57] ABSTRACT

A sense amplifier circuit for sensing a datum read from a mask ROM intended for shortening delays in read time due to the stray capacity of the bit line (B1) is disclosed. The circuit has a charging circuit (2, 3) and a discharging-current path (4, 5, 6). At the beginning of a read cycle, the charging circuit is connected to the bit line to promptly precharge the stray capacity. Subsequently an addressing signal is applied to a word line. If the addressed memory cell is an OFF bit, then the electric potential level of the bit line remains unchanged. If the memory cell is an ON bit, then the discharging-current path turns on, thereby enabling prompt discharge.

6 Claims, 3 Drawing Sheets

1

SENSE AMPLIFIER CIRCUIT

BACKGROUND OF THE INVENTION

1. Field of the Invention

The present invention relates to a sense amplifier circuit, and in particular to a sense amplifier circuit for a ROM intended to shorten delays in read time.

2. Description of the Prior Art

FIG. 1 shows a circuit diagram of a conventional sense amplifier circuit. A ROM shown in the figure is a mask ROM, and only one column of a storage matrix of semiconductor memory cells is depicted. From the memory cells shown in the figure, one bit datum is read. The sense amplifier circuit comprises a constant-current source 1 electrically connected to a bit line B1 of the column of memory cells 101, 102, - - -, 10$n$. An electric potential at bit line B1 with respect to the ground potential of the memory cell is detected at a terminal 80 as a sensed signal of the read datum. When no memory cell is addressed, i.e. when all word lines W101, W102, - - -, W10$n$ are in a low level state (hereafter referred to as L level), or when an addressed memory cell, i.e. a memory cell to which a high level gate potential (hereafter referred to as H level) is applied through a word line, is a destroyed memory cell (hereafter referred to as an OFF bit) as shown at memory cell 102, any current path between constant-current supply 1 and the ground is broken on account of the off state of all memory cells. Thus, bit line B1 has an electric potential of $V_{ss}$, which is detected at terminal 80 as the sensed signal of H level $V_1$. When, on the contrary, a retained (not destroyed) memory cell (hereafter referred to as an ON bit) as shown at N MOST (MOS transistor) 101, or 10$n$ is addressed by applying an H-level address signal to the word line, a drain current of a constant current intensity I is allowed to flow in the addressed memory cell. Since the circuit is designed so that the current intensity I is lower than the drain current $I_{D\,sat}$ in the saturated region of the $I_D$-$V_D$ characteristics of the N MOST for the gate potential applied as an address signal, the N MOST operates in the linear region of the $I_D$-$V_D$ characteristics in order to allow a drain current flow of intensity I. This causes the electric potential of bit line B1 to be L level lower than the pinch-off potential. As a result, a sensed signal of L level $V_2$ is provided at terminal 80.

In the sense amplifier circuit above, when an OFF bit is read after an ON bit is read, stray capacities present in read-data lines of all memory cells connected to the bit line B1 are charged by the constant current I with a charging time $t_1 = C(V_1 - V_2)/I$, where C denotes the resultant capacity of the stray capacities. When an ON bit is read after an OFF bit is read, the stray capacities are discharged with the discharging time constant $t_2 = C/g_d$ through the N MOST in the addressed ON bit, wherein $g_d$ denotes the channel conductance of the N MOST.

A problem encountered in the prior art sense amplifier circuit above has been that the rise and fall of each read cycle is delayed by $t_1$ and $t_2$, respectively, due to the stray capacities coupled to the bit line. In order to solve the problem, it is necessary to design both I to be high in order to reduce $t_1$ and $g_d$ of all memory cells to be high in order to reduce $t_2$. However, meeting the former requirement will cause an increase in power loss of the constant-current source, and meeting the latter requirement will take up a large occupation area of the ROM on an IC substrate in contradiction to the requirement for smaller scaling. It has been considered a further problem that, even when word lines to be addressed belong exclusively to a given group of word lines, and accordingly memory cells to be accessed are limited within those memory cells coupled to the given group of word lines, the stray capacities not only of the memory cells to be accessed but also of all other memory cells contribute to the delay in the read time.

SUMMARY OF THE INVENTION

It is an object of the present invention to provide a sense amplifier circuit for a ROM capable of decreasing the delay in the read time due to the stray capacity of the bit line.

It is another object of the present invention to provide a data sensing circuit for a doubly addressed ROM capable of decreasing the delay in the read time due to the stray capacity of each bit line.

In order to attain the first object above, a sense amplifier circuit according to the present invention includes a constant current source electrically connected to a bit line of one column of memory cells in a storage matrix of the ROM, the constant current source supplying a constant current to an addressed memory cell through the bit line to provide a second electric potential level at the bit line with respect to the ground potential of the memory cells when the addressed memory cell stores a datum corresponding to a second logic level, and leaving off supplying the constant current to provide a first electric potential level at the bit line when the addressed memory cell stores a datum corresponding to a first logic level, the improvement comprising a DC power source with a first electrode connected to the ground potential and a second electrode having an electric potential of the first electric potential level, a first transistor connected between the bit line and the second electrode of the DC power source, the first transistor allowing a charging current to flow from the DC power source for charging the stray capacity of the bit line when a precharge signal is at a first logic level, and cutting off the charging current when the precharge signal is at a second logic level, a second transistor connected to the bit line to provide a discharge-current path of the stray capacity, the second transistor being off when the precharge signal is at the first logic level and on when the precharge signal is at the second logic level, and a discharging circuit connected between the second transistor and the ground potential in cascode to the second transistor, and controlled by the electric potential of the bit line so as to be off when the electric potential of the bit line is at the first electric potential level and to be on when the electric potential of the bit line is at the second electric potential level, the discharge circuit making a transition from the off-state to the on-state at a predetermined threshold level between the first and second electric potential levels, wherein at the beginning of each read cycle, the precharge signal is set at the first logic level, then, after a predetermined time interval, the precharge signal is set at the second logic level and addressing the ROM is followed, and when the read cycle is finished, the precharge signal is reset at the first logic level.

In order to attain the second object above, a data sensing circuit according to the present invention includes sense amplifier circuits, each of which is adapted to be connected to a bit line of memory cells aligned in each column of a storage matrix of the ROM for sensing a bit datum of a word on the bit line, the word being selected through addressing a word line in the ROM, the addressing of the word line being effected through doubly modified addressing both by assigning a group address to a group of word lines to which the word line to be selected belongs and by assigning an intragroup address to each of the word lines within the group, the improvement comprising a selector for connecting the bit lines of memory cells connected to a group of word lines specified by a given group address to the corresponding sense amplifier circuits, the sense amplifier circuit being the circuit according to the present invention.

With these and other objects, advantages, and features of the present invention that may become apparent hereafter, the nature of the present invention will be more clearly understood with reference to the following detailed description of the invention, and the diagrams illustrated in the attached drawings.

DESCRIPTION OF THE PREFERRED EMBODIMENTS

Figure 2:
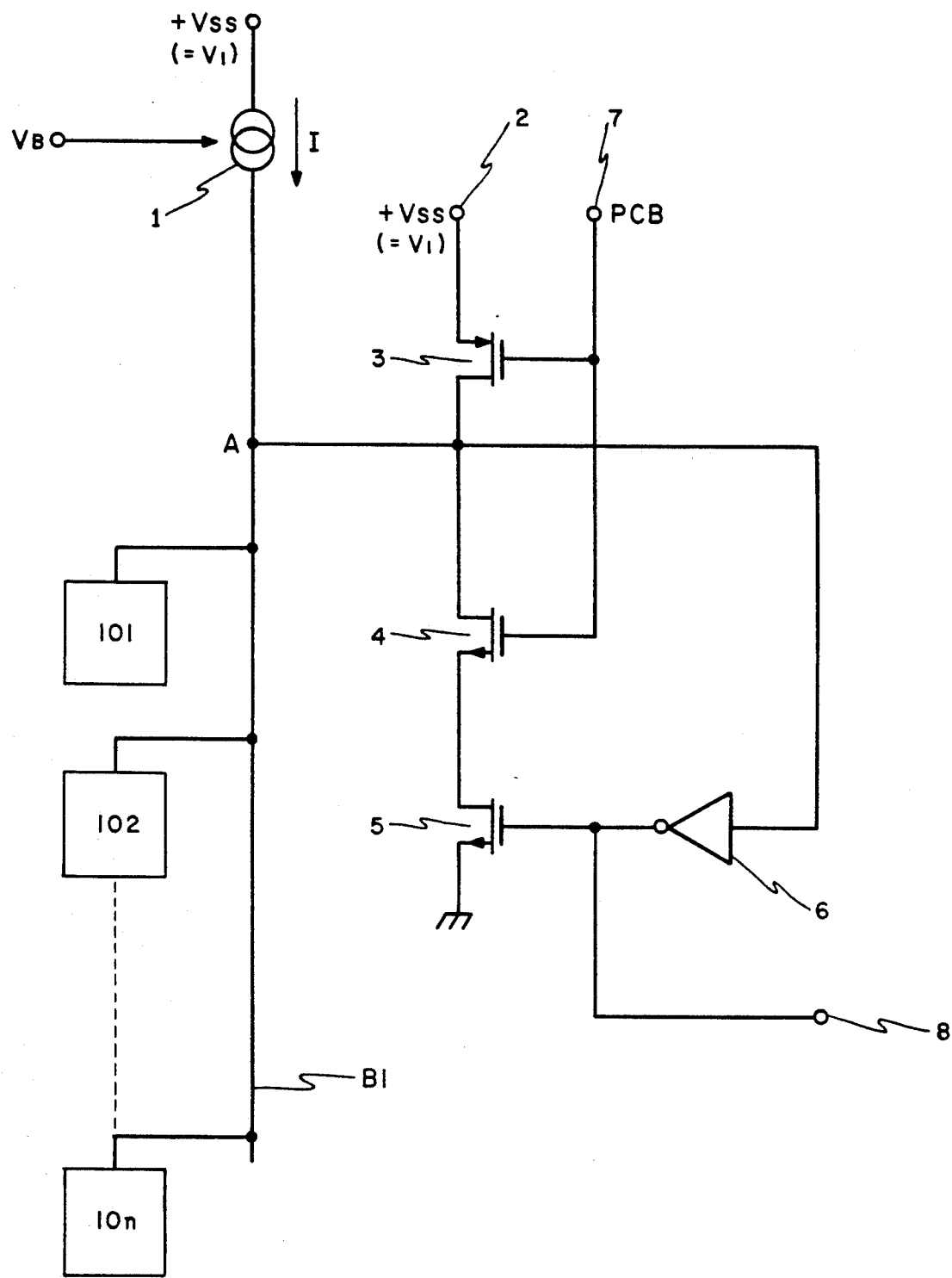
FIG. 2 is a circuit diagram of an embodiment of the sense amplifier circuit according to the present invention.

Referring to FIG. 2, an embodiment of the sense amplifier circuit according to the present invention will be given below.

Figure 1:
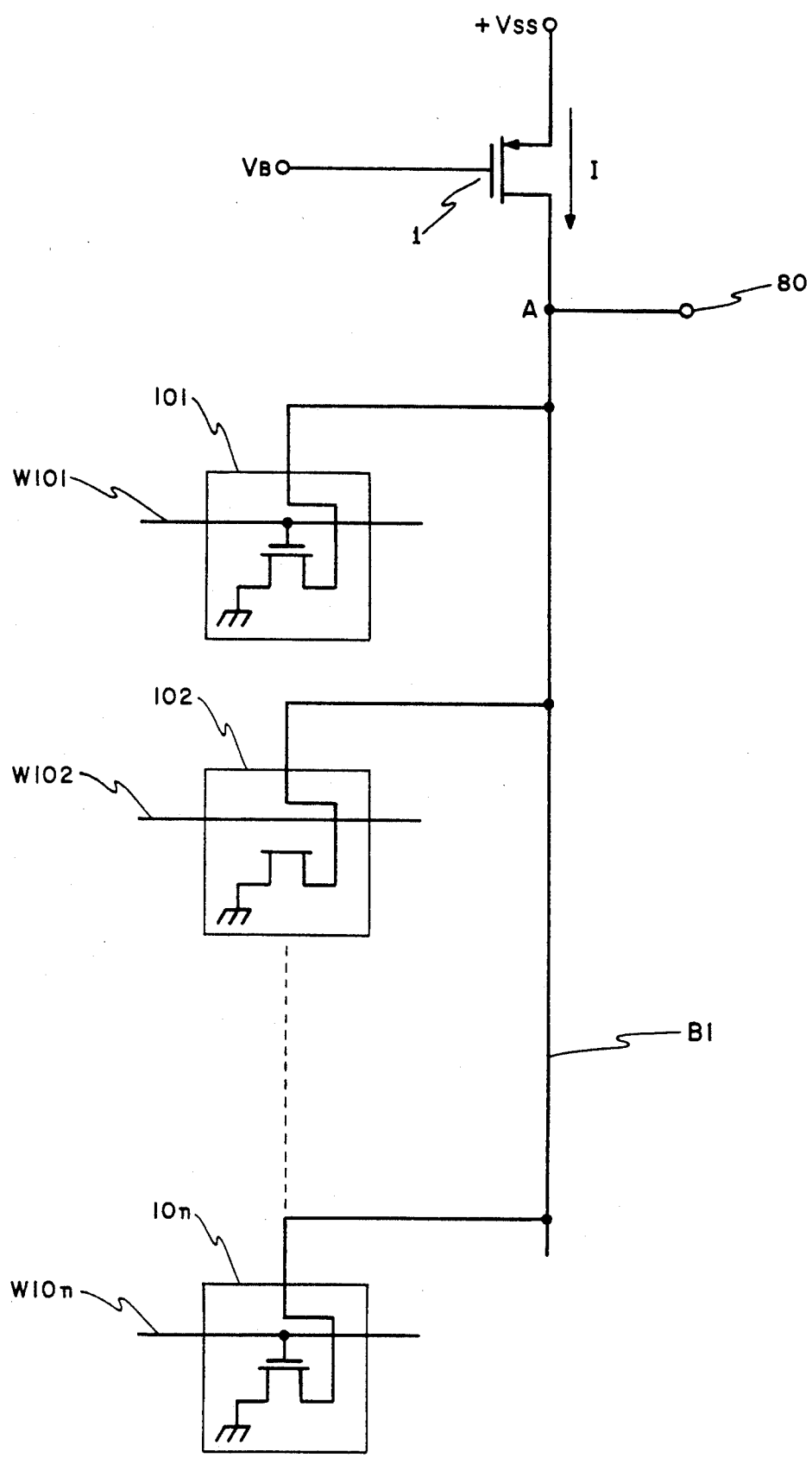
FIG. 1 is a circuit diagram of a conventional sense amplifier circuit.

A constant-current supply 1 and memory cells 101, 102, - - -, 10n of the sense amplifier circuit shown in FIG. 2 are similar to those already shown in FIG. 1 in function as well as circuit composition. A P MOST 3 and an N MOST 4 constitute a C MOST. The source of the P MOST 3 is connected to the positive electrode 2 of a DC power supply, and the junction of the P MOST 3 and the N MOST 4 is connected to the bit line B1 at a point A. Both gates of P MOST 3 and N MOST 4 are connected to an input terminal 7 for a precharge signal PCB. The potential of the electrode 2 of the DC power supply is set at high potential level $V_1$ of bit line B1 (the first electric potential level), while the negative electrode is grounded. The junction A is further connected to the input of an inverter 6. N MOST 5 is connected in cascode to N MOST 4. The source of N MOST 5 is grounded, and its gate is connected to the output of the inverter 6. The output of the inverter 6 provides an output 8 of the sense amplifier circuit. A circuit composed of N MOST 5 and inverter 6 is recited in claim 1 as a discharging circuit. As described with regard to the sense amplifier circuit shown in FIG. 1, the electric potential at junction A with respect to the ground potential makes a high level $V_1$ when the mask ROM is not accessed or when an OFF bit of the ROM is accessed, and makes an L-level $V_2$ (the second electric potential level) when an ON bit of the ROM is accessed. Hereafter $V_1 - V_2$ will be represented as $V_b$. A threshold input value of inverter 6 at which the output makes a transition from L to H level is predetermined to be at ($\frac{1}{3}$) $V_b$ below the high input level $V_1$. P MOST 3 and N MOSTs 4, 5 are designed to have high transconductances so as to shorten charge and discharge times of the stray capacity C of bit line B1 (a resultant capacity of stray capacities of data output circuits in memory cells 101, 102, - - -, 10n and the stray capacity of the input circuit of the inverter 6) to a desired value. In this embodiment, the charge and discharge times are prescribed to be $\frac{1}{2}$ the read cycle time $t_{RC}$, and thus MOSTs 3, 4 and 5 used have such transconductance that a drain current of each of these MOSTs exceeds $2CV_b t_{RC}$ when the gate input of P MOST 3 is at L level or when the gate inputs of N MOSTs 4, 5 are at H level.

In operation, the precharge signal is set at L level before a word line of the ROM is activated to read a word. The precharge signal causes P MOST 3 to turn on. As a result, DC power supply 2 is connected to bit line B1, thereby charging stray capacity C between the bit line and the ground. When the charging has been finished, bit line B1 is at the first electric potential level $V_1$. During the period that the precharge signal is at L level, N MOSTs 4 and 5 are in an off state to prevent a stationary current from flowing to the ground from DC power supply 2 and constant-current power supply 1. The precharge signal is subsequently set at H level, whereby the connection between DC power supply 2 and bit line B1 is cut off, and at the same time N MOST 4 turns on. However, at this time N MOST 5 is left in the off state because the output of inverter 6 still remains at L level.

Next, a word line to be addressed is activated. If a memory cell connected to the activated word line is an OFF bit corresponding to a datum "0," the bit line connected to the OFF bit continues to be at the first potential level (H level), which means that "0" has been read out without any read time at all. If a memory cell connected to the word line is an ON bit corresponding to a datum "1," the memory cell turns on, causing the potential of the bit line connected to the ON bit to begin to lower, and when the potential of the bit line is lowered by $V_b/3$, the output of inverter 6 is inverted to H level, causing N MOST 5 to turn on and thus an electric charge stored in the stray capacity to discharge rapidly. After the read cycle time is over and the word line is subsequently made inactive, the precharge signal is reset to L level to prepare for the next read cycle. Since the transconductance in P MOST 3 and N MOSTs 4, 5 is sufficiently high, as described above, the charging and discharging of the stray capacity substantially terminate within $t_{RC}/2$.

It will be appreciated that, since DC power supply 2 supplies a current necessary for promptly charging the stray capacity, it is not necessary for the constant-current source 1 to supply an intense constant current in order to provide a rapid rise of a read-out signal by shortening the charging time. Moreover, the power consumed by DC power supply 2 is small since it is the sum of the electrostatic energy stored in the stray capacity and the power consumed in P MOST 3 during the charging period. The DC power supply 2 therefore need not be of a high wattage, but capable of supplying a large current during the short charging time. Thus, a DC power supply of a small internal resistance was used in this embodiment. Similarly, the discharging time is shortened, because N MOSTs 4, 5 provide a discharging path of the stray capacity. Accordingly, it is not necessary to use a MOST having a high channel conductance (i.e., a large occupation area) in a ROM cell in order to shorten the discharging time.

Figure 3:
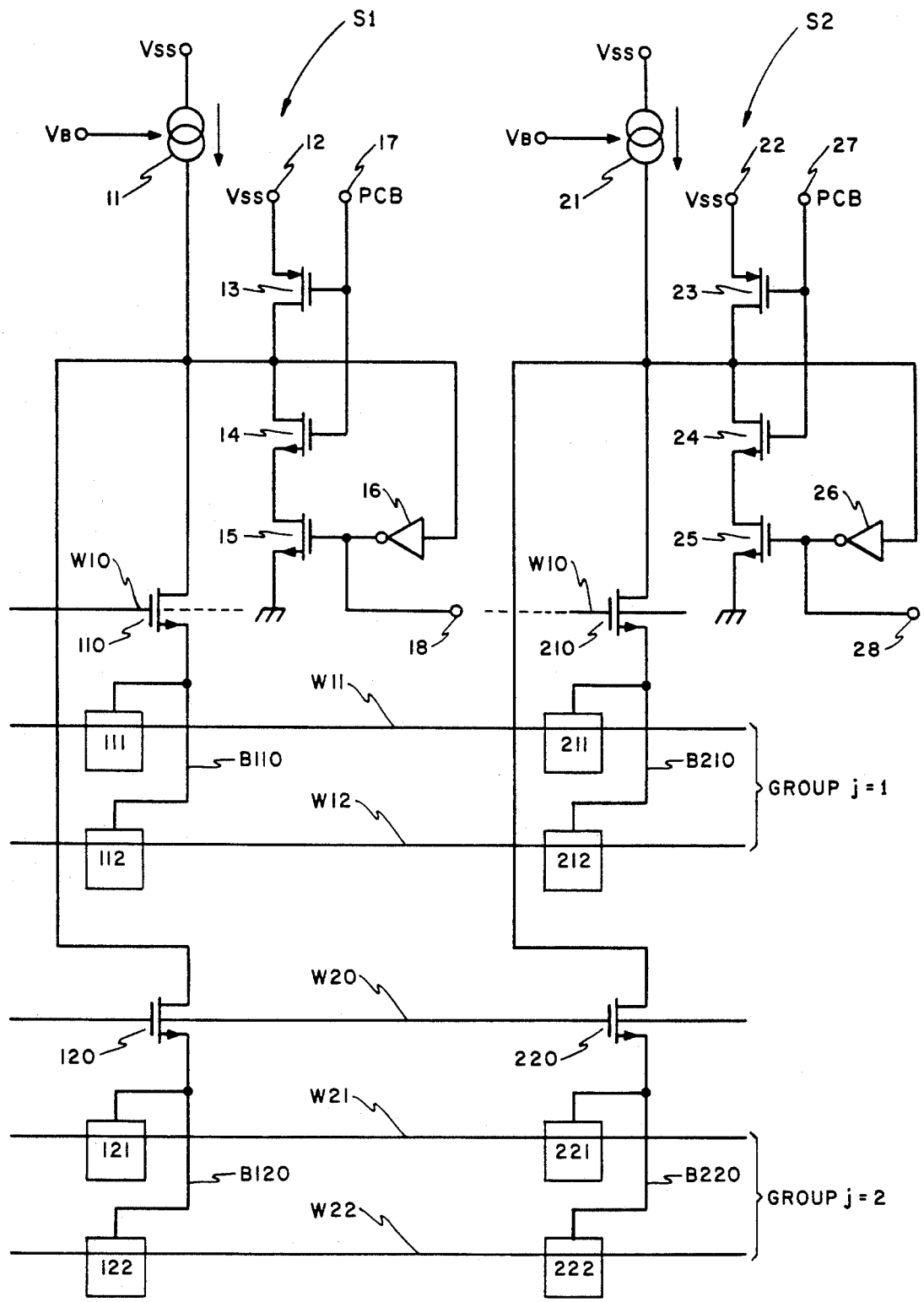
FIG. 3 is a circuit diagram of an embodiment of the data sensing circuit according to the present invention.

Referring now to FIG. 3, another embodiment of the present invention will be given below. The embodiment relates to a data sensing circuit provided with sense amplifier circuits as described above. For simplicity, the embodiment will be given with regard to a ROM comprising a 4-row 2-column storage matrix of memory cells.

Each memory cell of the storage matrix is indicated by a triply modified address ijk, wherein i, j, k stand for a bit address, a group address, and an intragroup address, respectively, and 0 stands for N MOSTs constituting a selector which will be described below. Row elements of the storage matrix 1jk, 2jk are selected by specifying word lines wjk commonly connected to the memory cells 1jk, 2jk. The addressing of the word line wjk is effected through doubly modified addressing both by assigning a group address j to a group of word lines to which the word line to be addressed belongs, and by assigning an intragroup address k to each of the word lines within the group.

N MOSTs 110, 210, 120, 220 or N MOST ij0 (i=1, 2, j=1, 2) constitute a selector. Each N MOST ij0 is adapted for connecting bit lines Bijo to a sense amplifier circuit Si. When word line W21 is to be addressed for instance, the addressing is effected by indicating group address 2 and intragroup address 1. When group address j is specified to be 2, word line W20 of the selector, which belongs to group 2, is activated. In this way, by specifying the group address j to be 2 bit lines B120 and B220 are connected to the respective sense amplifier circuits S1, S2. Further, when the intragroup address k is specified to be 1 (i.e., when the doubly modified addressing of the word line W21 is completely carried out), the memory cells 121, 221 are read. In this example, bit lines B110, B210 of the memory cells connected to the word lines W11, W12 of the other group j=1 are not connected to the corresponding sense amplifier circuits. As a result, the read time of memory cells connected to the word lines of a given group address (j=2) is not affected by the stray capacities of the bit lines belonging to the other group (j=1). The N MOSTs 110, 210, 120, 220 constitute a selector as claimed in claim 6. The sense amplifier circuits according to the present invention are used as sense amplifier circuits in this embodiment.

It is to be understood that variations and modifications of the sense amplifier circuit in combination with the mask ROM disclosed herein will be evident to those skilled in the art. For example, the discharging circuit set forth in the first embodiment may be constituted by a P MOSFET and a buffer. DC sources with a negative voltage may also be employed in place of constant-current source 1 and DC power supply 2, respectively, by connecting MOSFETs so as to allow electric currents to flow in the opposite direction. It is intended, however, that all such modifications and variations be included within the scope of the appended claims.

What we claim is:

1. A sense amplifier circuit for sensing a read datum from a ROM, the circuit including a constant current source electrically connected to a bit line of one column of memory cells in a storage matrix of the ROM, the constant current source supplying a constant current to an addressed memory cell through the bit line to provide a second electric potential level at the bit line with respect to the ground potential of the memory cells when the addressed memory cell stores a datum corresponding to a second logic level, and leaving off supplying the constant current to provide a first electric potential level at the bit line when the addressed memory cell stores a datum corresponding to a first logic level, the improvement comprising, a DC power source with a first electrode connected to the ground potential and a second electrode having an electric potential of the first electric potential level, a first transistor connected between the bit line and the second electrode of the DC power source, the first transistor allowing a charging current to flow from the DC power source for charging a stray capacity of the bit line when a precharge signal is at a first logic level, and cutting off the charging current when the precharge signal is at a second logic level, a second transistor connected to the bit line to provide a discharge-current path of the stray capacity, the second transistor being off when the precharge signal is at the first logic level and on when the precharge signal is at the second logic level, and a discharging circuit connected between the second transistor and the ground potential in cascode to the second transistor, and controlled by the electric potential of the bit line so as to be off when the electric potential of the bit line is at the first electric potential level and to be on when the electric potential of the bit line is at the second electric potential level, the discharging circuit making a transition from the off-state to the on-state at a predetermined threshold level between the first and second electric potential levels, wherein at the beginning of each read cycle the precharge signal is set at the first logic level, then, after a predetermined time interval, the precharge signal is set at the second logic level and addressing the ROM is followed, and when the read cycle is finished, the precharge signal is reset at the first logic level.

2. A sense amplifier circuit as claimed in claim 1, wherein the first transistor and the second transistor constitute a complementary MOSFET.

3. A sense amplifier circuit as claimed in claim 1, wherein the discharging circuit comprises an inverter with an input coupled to the bit line, and a third transistor connected between the second transistor and the ground potential in cascode to the second transistor and having the gate electrode coupled to the output of the inverter, the inverter providing outputs of first and second states when the input is in the states of the first and second electric potential levels, respectively, and operating to allow the output to make a transition at a predetermined threshold level of the input between the first and second electric potential levels, and the third transistor being off when the output of the inverter is in the first state and on when the output of the inverter is in the second state.

4. A sense amplifier circuit as claimed in claim 3, wherein each of the first, second and third transistors has such transconductance characteristics that the drain current in each of the first transistor for the first logic level of the precharge signal, the second transistor for the second logic level of the precharge signal and the third transistor for the second state of the output of the inverter is $CV_b/t_0$ or more in intensity, wherein C denotes the resultant capacity of the output capacities of the memory cells connected to the bit line and the input capacity of the inverter, $t_0$ denotes a predetermined time duration for the resultant capacity to be charged or discharged, and $V_b$ represents the difference between the first and second electric potential levels of the bit line.

5. A sense amplifier circuit as claimed in claim 3, wherein the predetermined threshold level of the input of the inverter to make a transition in the output from the first state to the second state is set at a level of $(\frac{2}{3})V_b$ measured from the second electric potential level of the bit line.

6. A data-sensing circuit including sense amplifier circuits, each of which is adapted to be connected to a bit line of memory cells aligned in each column of a storage matrix of a ROM for sensing a bit datum of a word on the bit line, the word being selected through addressing a word line in the ROM, the addressing of the word line being effected through doubly modified addressing by assigning both a group address to a group of word lines to which the word line to be selected belongs and an intragroup address to each of the word lines within the group, the improvement comprising a selector for connecting the bit lines of memory cells connected to a group of word lines specified by a given group address to the corresponding sense amplifier circuits, the sense amplifier circuit being the circuit recited in claim 1.

* * * * *